(12) United States Patent
Hong et al.

(10) Patent No.: US 10,985,095 B2
(45) Date of Patent: Apr. 20, 2021

(54) POWER MODULE FOR VEHICLE

(71) Applicants: Hyundai Motor Company, Seoul (KR); Kia Motors Corporation, Seoul (KR)

(72) Inventors: Kyoung-Kook Hong, Gyeonggi-Do (KR); Youngseok Kim, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/824,114

(22) Filed: Nov. 28, 2017

(65) Prior Publication Data

US 2019/0103343 A1  Apr. 4, 2019

(30) Foreign Application Priority Data

Sep. 29, 2017 (KR) .......................... 10-2017-0127344

(51) Int. Cl.
| | | |
|---|---|---|
| *H01L 23/495* | (2006.01) | |
| *H01L 23/373* | (2006.01) | |
| *H01L 23/498* | (2006.01) | |
| *H01L 21/48* | (2006.01) | |
| *H01L 23/31* | (2006.01) | |

(52) U.S. Cl.
CPC .... *H01L 23/49568* (2013.01); *H01L 21/4825* (2013.01); *H01L 21/4828* (2013.01); *H01L 23/3735* (2013.01); *H01L 23/49558* (2013.01); *H01L 23/49575* (2013.01); *H01L 23/49586* (2013.01); *H01L 23/49811* (2013.01);

(Continued)

(58) Field of Classification Search
CPC ............ H01L 23/142; H01L 23/49506; H01L 23/49513; H01L 23/49548; H01L 23/49531; H01L 23/49524; H01L 23/49861; H01L 23/49822; H01L 23/5383; H01L 23/49568
See application file for complete search history.

(56) References Cited

U.S. PATENT DOCUMENTS 3,790,859 A * 2/1974 Schraeder ............. H01L 23/467
                                                                174/16.3
3,959,016 A * 5/1976 Tsuda ...................... H01M 4/82
                                                                29/2

(Continued)

OTHER PUBLICATIONS

Schulz-Harder, J., "DCB substrates: solution for high temperature applications", High Temperature Electronics, 1999. HITEN 99. The Third European Conference on, Jul. 1999, Abstract.*

*Primary Examiner* — Vincent Wall
(74) *Attorney, Agent, or Firm* — Mintz Levin Cohn Ferris Glovsky and Popeo, P.C.; Peter F. Corless

(57) ABSTRACT

A vehicle power module for converting power includes a lead frame configured to receive power from outside or to output power to the outside and a substrate configured to be bonded with the lead frame. The substrate includes a pattern layer disposed to be electrically connected to the lead frame, a conductive layer disposed apart from the pattern layer and configured to be electrically grounded, and an insulating layer disposed between the conductive layer and the pattern layer to insulate the pattern layer from the conductive layer. The pattern layer further protrudes toward the lead frame than the insulating layer.

8 Claims, 8 Drawing Sheets

(52) U.S. Cl.
CPC .... *H01L 23/49838* (2013.01); *H01L 23/3107* (2013.01); *H01L 23/49555* (2013.01)

(56) References Cited

U.S. PATENT DOCUMENTS

| | | | |
|---|---|---|---|
| 5,274,197 A * | 12/1993 | Kondo | H01L 23/49531 174/267 |
| 8,593,817 B2 * | 11/2013 | Bayerer | H01L 25/072 361/729 |
| 9,472,493 B1 * | 10/2016 | Tzu | H01L 23/49568 |
| 9,627,356 B2 * | 4/2017 | Hohlfeld | H01L 23/49827 |
| 9,633,927 B2 * | 4/2017 | Mahler | H01L 23/48 |
| 2005/0029666 A1 * | 2/2005 | Kurihara | H01L 23/3114 257/772 |
| 2005/0263566 A1 * | 12/2005 | Su | B23K 20/004 228/44.3 |
| 2014/0299982 A1 * | 10/2014 | Minamio | H01L 24/85 257/712 |
| 2015/0340350 A1 * | 11/2015 | Koga | H01L 24/48 257/713 |
| 2017/0062317 A1 * | 3/2017 | Son | H01L 23/49575 |
| 2018/0082921 A1 * | 3/2018 | Grassmann | H01L 23/3675 |
| 2018/0096919 A1 * | 4/2018 | Roth | H01L 21/561 |

* cited by examiner

POWER MODULE FOR VEHICLE

CROSS-REFERENCE TO RELATED APPLICATION

This application claims under 35 U.S.C. § 119(a) the benefit of Korean Patent Application No. 10-2017-0127344, filed on Sep. 29, 2017, the entire contents of which are incorporated herein by reference.

BACKGROUND

1. Technical Field

The present disclosure relates to a vehicle power module that converts power, more particularly, to a vehicle power module in which a lead frame receives power from outside and a substrate is bonded to the lead frame.

2. Discussion of Related Art

Vehicles include an internal combustion engine vehicle (also referred to as a general engine vehicle) that generates mechanical power by burning a petroleum-based fuel such as gasoline or diesel, and uses the mechanical power to drive the vehicle, and an eco-friendly vehicle driven by electricity to reduce fuel consumption and toxic gas emission.

The eco-friendly vehicle includes an electric vehicle including a battery and a motor, which serve as a rechargeable power source, where the electric vehicle drives the wheels by using rotation of the motor. Eco-friendly vehicles include a hybrid vehicle utilizing power of an engine and a motor, and a hydrogen fuel cell vehicle that utilizes electric power of a motor.

Vehicles powered by batteries and motors typically include power modules such as an inverter and a converter that convert power of the battery to power for driving the motor, and convert power generated by a generator to power for charging the battery.

Such power modules typically include an insulation layer for insulation from the outside, and an insulation circuit board to which a pattern layer and a conductive layer are attached at upper and lower portions thereof with the insulation layer as a center.

In general, the insulation circuit board includes a DBC (Direct Bonded Copper) substrate formed by oxidizing and bonding an insulating layer made of alumina ($Al_2O_3$) ceramic, a pattern layer made of copper (Cu), and a conductive layer.

In general, the pattern layer of the insulation circuit board and the lead frame can be bonded by a soldering method, but the soldering method has a limited use temperature and service life.

Recently, ultrasonic welding (UW) has been attempted for bonding the pattern layer and the lead frame, but an insulating layer of an insulation circuit board may be damaged due to excessive force and vibration applied to the insulation circuit board during ultrasonic welding.

In order to improve a mechanical strength of the insulating layer, silicon nitride ($Si_3N_4$) ceramics having a high strength compared with alumina ceramics can be applied, but the price is increased and silicon nitride ceramics also cannot completely prevent mechanical impact.

SUMMARY

The present disclosure provides a power module for a vehicle for reducing breakage of an insulating layer formed of ceramics that may occur in a process of bonding a lead frame to a substrate by an ultrasonic welding method.

The present disclosure provides a power module for a vehicle which eliminates an insulating layer under a pattern layer in which a lead frame is bonded so that a force applied to the substrate is not applied to the insulating layer in a process of bonding the lead frame to a substrate by an ultrasonic welding method.

In accordance with one aspect of the present disclosure, a power module for a vehicle includes a lead frame configured to receive power from outside or to output power to the outside; and a substrate configured to be bonded with the lead frame, wherein the substrate includes: a pattern layer disposed to be electrically connected to the lead frame, a conductive layer disposed apart from the pattern layer and configured to be electrically grounded, and an insulating layer disposed between the conductive layer and the pattern layer to insulate the pattern layer from the conductive layer, wherein the pattern layer further protrudes toward the lead frame than the insulating layer.

The pattern layer may include a first pattern portion in contact with the insulating layer and a second pattern portion in contact with the lead frame.

The pattern layer may further include a third pattern portion provided between the first pattern portion and the second pattern portion such that the first pattern portion and the second pattern portion are spaced apart from each other.

The lead frame may include a first lead end facing outwardly and a second lead end opposite the first lead end, and the insulating layer may include a first insulating end adjacent the lead frame and a second insulating end opposite the first insulating end, and a horizontal distance between the first lead end and the second lead end may be shorter than a horizontal distance between the first lead end and the first insulation end.

The pattern layer may include a first pattern end adjacent to the lead frame and a second pattern end opposite to the first pattern end, and the lead frame may be bonded to the pattern layer between the first pattern end and the first insulating end.

An area between the first pattern end and the first insulating end may be larger than an area of the lead frame bonded to the pattern layer.

The lead frame may be bonded to the pattern layer by ultrasonic welding.

The power module for a vehicle may further comprise a support member disposed on the other side of the pattern layer to prevent the pattern layer from bending when the lead frame is bonded to one side of the pattern layer.

The insulating layer may comprise an alumina ceramic material.

The power module for a vehicle may further comprise a molding member surrounding the substrate to reinforce bonding of the lead frame and the pattern layer.

The pattern layer may have a thickness of 0.15 mm or more.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION OF EXEMPLARY EMBODIMENTS

Figure 1:
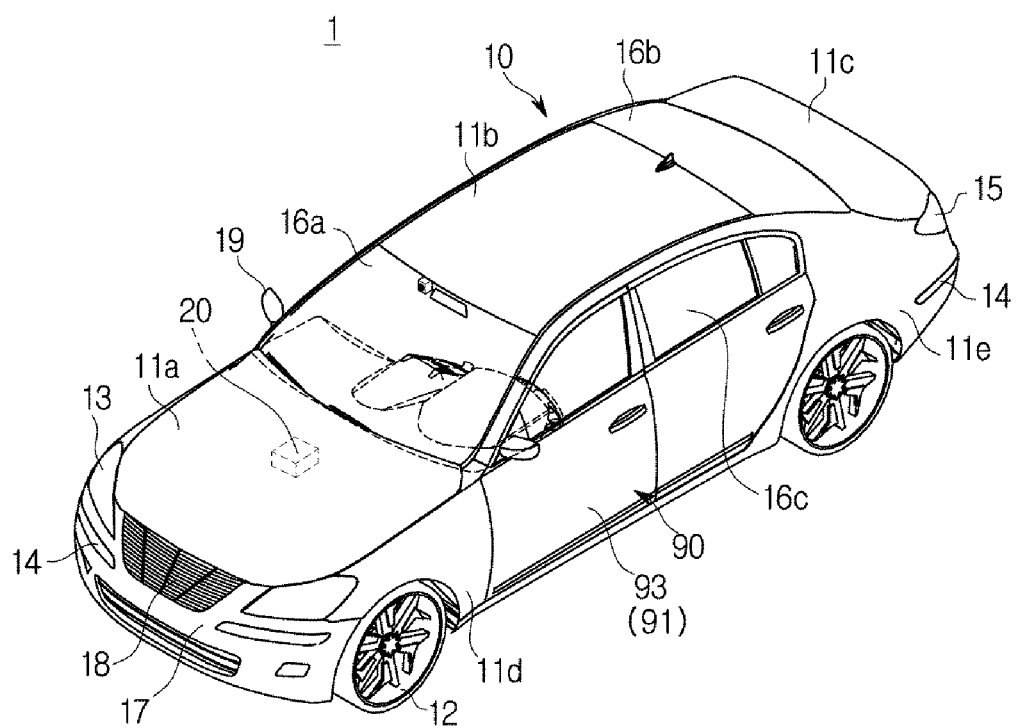
FIG. 1 is a view illustrating an appearance of a vehicle including a vehicle power module according to the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

The embodiments described herein and the configurations shown in the drawings are only examples of preferred embodiments of the present disclosure, and various modifications may be made at the time of filing of the present application to replace the embodiments and drawings of the present specification.

In addition, the same reference numerals or symbols shown in the drawings of the present specification indicate components or components that perform substantially the same function.

It is also to be understood that terms including ordinals such as "first", "second" and the like used herein may be used to describe various elements, but the elements are not limited to the terms, it is used only for the purpose of distinguishing one component from another. For example, the first component may be referred to as a second component, and similarly, the second component may also be referred to as a first component. The term "and/or" includes any combination of a plurality of related listed items or any of the plurality of related listed items.

The terms "front", "rear", "upper" and "lower" used in the following description are defined based on the drawings, and the shape and position of each component are not limited by these terms.

Hereinafter, embodiments according to the present disclosure will be described in detail with reference to the accompanying drawings.

FIG. 1 is a view illustrating an appearance of a vehicle including a vehicle power module according to the present disclosure.

As shown in FIG. 1, the vehicle 1 may include a vehicle body 10 that forms an appearance of the vehicle 1 and a wheel 12 that moves the vehicle 1.

The vehicle 1 refers to various devices that move objects to be transported from a departure point to a destination. The vehicle 1 may include vehicles that run on roads or tracks, ships that move over the sea or a river, and airplanes that fly through the sky using air.

Further, the vehicle 1 running on a road or a track can move in a predetermined direction in accordance with the rotation of at least one wheel, and can include a three-wheeled or four-wheeled vehicle, a construction machine, a two-wheeled vehicle, a prime mover, bicycles and trains running on a track.

The vehicle body 10 includes a hood 11a for protecting various devices for driving the vehicle 1 such as an engine, a roof panel 11b for forming an indoor space, a trunk lid 11c provided with a storage space, a front fender 11d and a quarter panel 11e provided on a side surface of the vehicle 1.

Further, a plurality of doors 90 hinged to the vehicle body 10 may be provided on the side surface of the vehicle body 10. The door 90 may include a door panel 91 which is a plate made of metal or plastic. The door panel 91 may include a door outer panel 93 that forms the appearance of the vehicle 1.

On the upper side of the door 90, a side window 16c may be provided to provide a side view of the vehicle 1. A front window 16a may be provided between the hood 11a and the roof panel 11b to provide a front view of the vehicle 1 and a rear window 16b may be provided between the roof panel 11b and the trunk lid 11c to provide a rear view of the vehicle 1.

The door 90 may include a side mirror 19 for monitoring the rear side.

A head lamp 13 for illuminating toward the traveling direction of the vehicle 1 may be provided on front of the vehicle 1. A turn signal lamp 14 for indicating a traveling direction of the vehicle 1 may be provided on the front or rear of the vehicle 1.

A tail lamp 15 may be provided at the rear of the vehicle 1 to indicate a gear shifting state of the vehicle 1, the brake operating state, and the like.

The vehicle body 10 may include a front bumper 17 and a radiator grille 18 and the like.

At least one vehicle control unit 20 for performing electronic control related to an operation of the vehicle 1 may be provided inside the vehicle 1.

Figure 2:
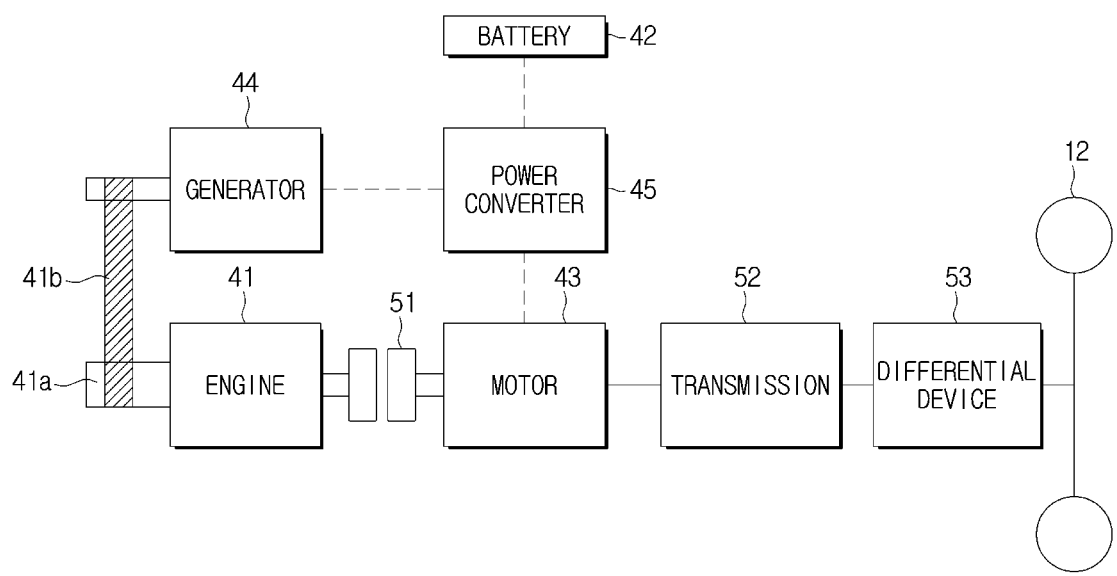
FIG. 2 is a view illustrating an internal configuration of a vehicle including a vehicle power module according to the present disclosure.

FIG. 2 is a view illustrating an internal configuration of a vehicle including a vehicle power module according to the present disclosure.

As shown in FIG. 2, The vehicle 1 includes a power unit (not shown) for applying a driving force to the wheels 12 disposed at front, rear, left, and right sides, a steering unit (not shown), a braking unit for applying a braking force to the wheels 12 and a suspension unit (not shown).

The power unit (not shown) may include a power generating device (not shown) for generating a driving force necessary for driving the vehicle 1 and a power transmission device (not shown) for regulating the generated driving force.

The power generating device (not shown) may include engine 41, fuel device (not shown), cooling device (not shown), fuel supply device (not shown), a battery 42, a motor 43, a generator 44, and a power converter 45.

The power transmission device (not shown) may include a clutch 51, a transmission 52, a longitudinal reduction device (not shown), a differential device 53, and the like.

The engine 41 generates mechanical power by burning petroleum fuel such as gasoline and diesel. The battery 42 generates electric power through a high-voltage current and supplies the generated electric power to the motor 43. The battery 42 is charged with power generated by the generator 44.

The motor 43 converts the electric energy of the battery 42 into mechanical energy for operating various devices provided in the vehicle 1.

The generator 44 is a starter and may be connected to a crankshaft 41a of the engine 41 by a belt 41b. The generator 44 operates as the motor 43 when the generator 44 is interlocked with the crankshaft 41a of the engine 41 to start the engine 41. The generator 44 charges the battery 42 when the engine 41 is not driving the wheels 12.

That is, the generator 44 operates as a generator by the self-power of the engine 41 or by power transmitted through the engine 41 under an energy regenerating condition by braking, decelerating, or low-speed driving to charge the battery 42.

The vehicle 1 is supplied with electric power from a charger disposed in a parking lot or a charging station and charges the battery 42 using the supplied electric power.

The power converter 45 converts the electric power of the battery 42 into the driving electric power of the motor 43 or converts the electric power generated from the generator 44 into the electric power for charging the battery 42. The power converter 45 converts the electric power of the battery 42 into the driving power of the generator 44.

The power converter 45 may include an inverter and a converter, and may include at least one vehicle power module 100. A detailed description of the vehicle power module 100 will be given later. The power converter 45 converts a direction and an output of a current between the motor 43 and the battery 42.

The clutch 51 may be closed when generating a driving force using only the engine 41 and may be opened when the driving force is generated using an electric power of the battery 42.

For example, the clutch 51 may be opened in a deceleration driving or a low-speed driving using the motor 43, may be opened even when braking is performed, and may be closed in an acceleration driving and a constant-speed driving.

The transmission 52 transmits a rotational motion of the engine 41 and the motor 43 to the wheel 12.

The differential device 53 may be provided between the transmission 52 and the wheel 12 to generate a driving force by adjusting a gear ratio of the transmission 52 and to transmit the generated driving force to the left and right wheels 12.

The vehicle 1 may include an auxiliary battery (not shown) which generates a low-voltage current and is electrically connected to an audio equipment, an indoor lamp, and other electronic devices. The auxiliary battery (not shown) supplies the generated low-voltage current to the audio equipment, the indoor lamp, and other electronic devices as driving power.

Figure 3:
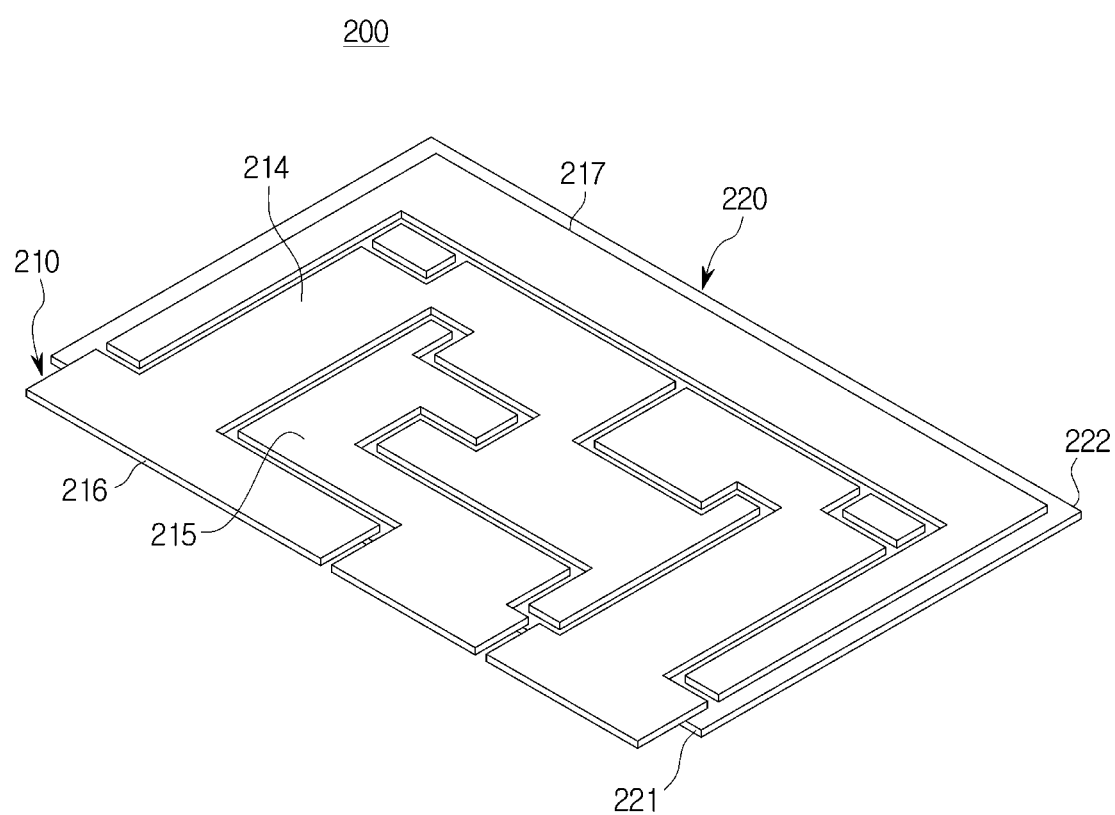
FIG. 3 is a perspective view of a substrate for a vehicle power module according to the present disclosure.
Figure 4:
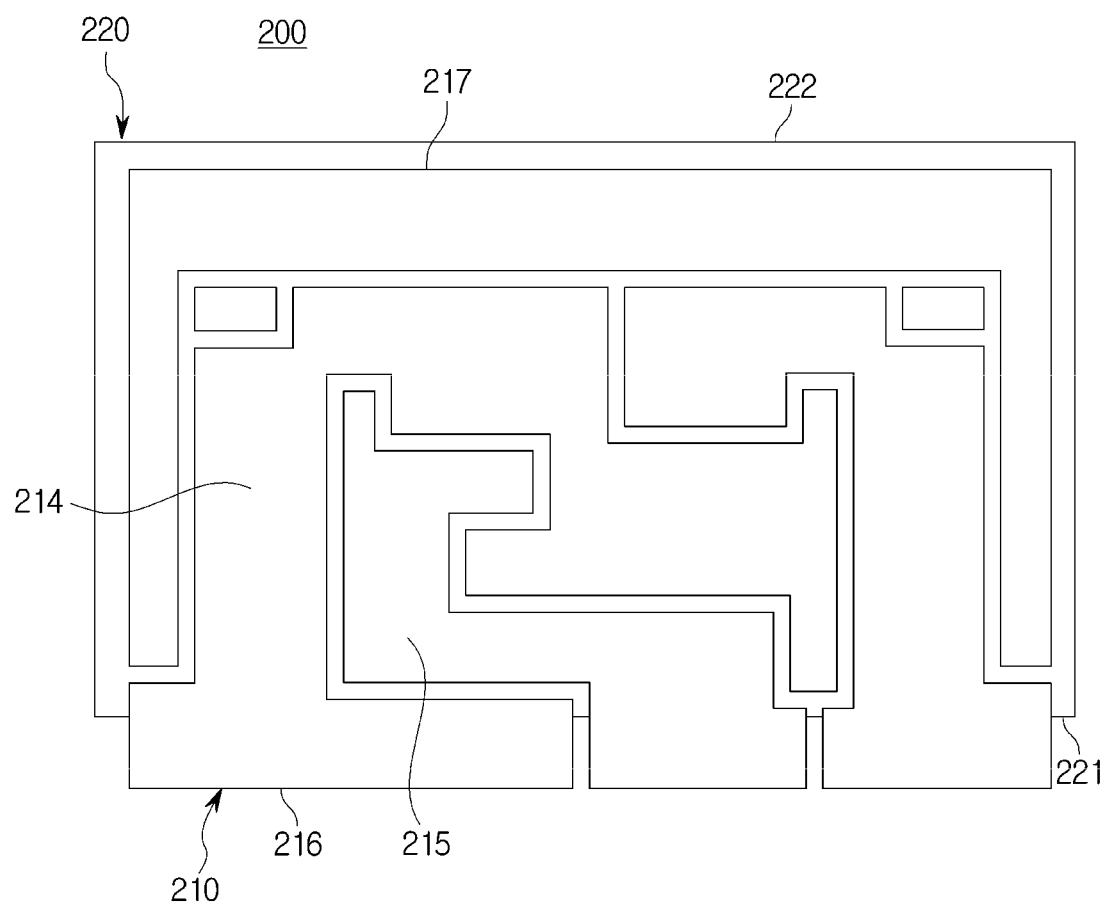
FIG. 4 is a cross-sectional view of a substrate for a vehicle power module according to the present disclosure shown in FIG. 3.

FIG. 3 is a perspective view of a substrate for a vehicle power module according to the present disclosure and FIG. 4 is a cross-sectional view of a substrate for a vehicle power module according to the present disclosure shown in FIG. 3.

Figure 5:
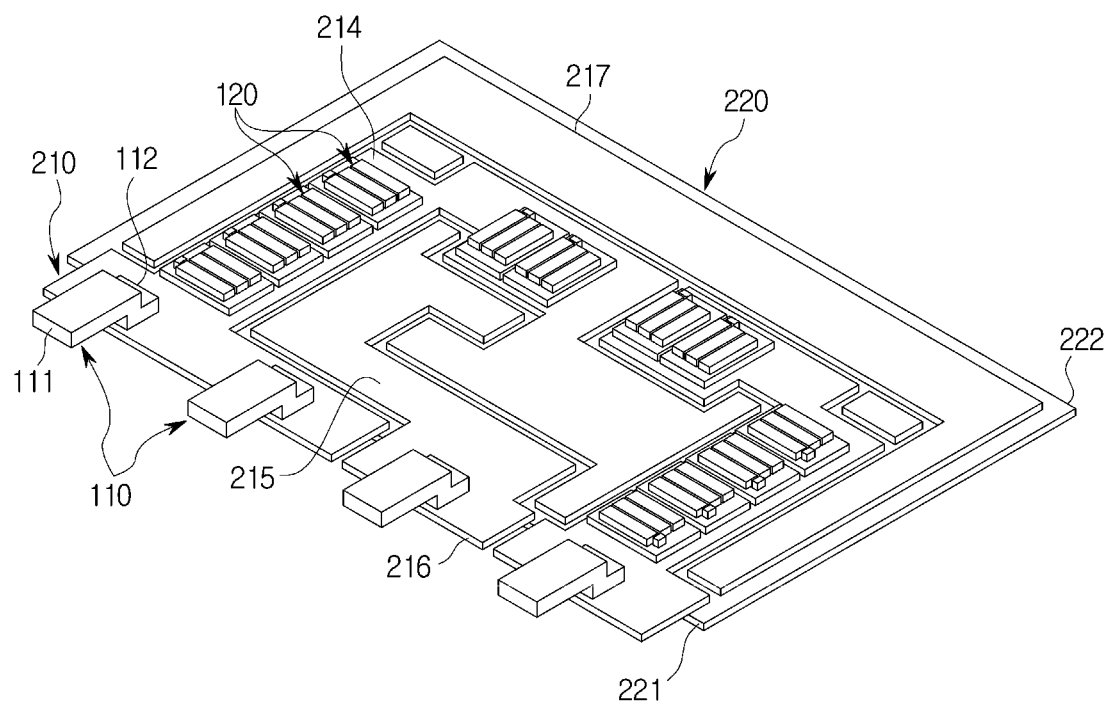
FIG. 5 is a perspective view of a vehicle power module according to the present disclosure.

FIG. 5 shows the vehicle power module 100 may include the substrate 200 depicted in FIGS. 3 and 4.

The power module 100 provided in the vehicle 1 according to an embodiment of the present disclosure is described, but the power module 100 may be provided in various electronic devices as well as the vehicle 1.

In particular, the electronic device may be a device having a component configured such that an input power is different from power used for driving. The electronic device may be a device that includes the motor 43 (see FIG. 2) and may be a device that includes the motor 43 and the battery 42.

For example, the electronic device including the motor 43 may include a refrigerator, an air conditioner, a washer, a vacuum cleaner and personal mobility, and the electronic device including the battery 42 may include a mobile device or the like.

An electronic device including both the battery 42 and the motor 43 may include a remote control device such as a robot, personal mobility and a drone.

The electronic device may include a low-power element to which a low voltage is applied to control a small current and a power element to which a high voltage is applied to control a large current. The vehicle power module 100 according to the present disclosure may include a power element to which a high voltage or a high current may flow therein.

The substrate 200 may include a printed circuit board (PCB).

The substrate 200 includes a pattern layer 210, a conductive layer 230 (see FIG. 7) disposed to be spaced apart from the pattern layer 210 and configured to be electrically grounded, and an insulating layer 220 disposed between the pattern layer 210 and the conductive layer 230 to isolate the pattern layer 210 from the conductive layer 230.

The substrate 200 may include an insulation circuit board including the insulating layer 220.

The pattern layer 210, the insulating layer 220, and the conductive layer 230 may include a rectangular shape. However, it is not limited thereto.

The pattern layer 210 may be formed of a material having a high electrical conductivity and a high thermal conductivity to emit heat. For example, the pattern layer 210 may be composed of a metal such as copper (Cu) or aluminum (Al).

The pattern layer 210 may constitute a plurality of pattern layers through an selective etching process.

The insulating layer 220 may isolate the pattern layer 210 from the conductive layer 230 and an outside. The insulating layer 220 may be formed of a material having a low electrical conductivity and a high thermal conductivity. For example, the insulating layer 220 may be composed of a ceramic material such as alumina ($Al_2O_3$).

The conductive layer 230 may be electrically grounded. The conductive layer 230 may be made of a material having a high electrical conductivity and a high thermal conductivity. For example, the conductive layer 230 may be composed of a metal such as copper (Cu) or aluminum (Al).

The pattern layer 210 may include an element portion 214 and a conductive portion 215. The element portion 214 and the conductive portion 215 may be provided in plural. The plurality of element portions 214 and the plurality of conductive portions 215 may be spaced apart from each other by the etching process of the pattern layer 210. However, it is not limited thereto.

The pattern layer 210 may include a frame terminal (not shown) and may be connected to an external controller (not shown) through the frame terminal (not shown) 214. The pattern layer 210 may transmit a control signal of the external controller (not shown) to the element unit 214.

The conductive portion 215 may emit heat generated when power is input or output to an outside, and the conductive portion 215 may emit heat generated by driving the element portion 214 to the outside.

The conductive portion 215 is a passage through which heat and electricity are transferred, and transmits an electric power to another conductive object such as the element portion 214. The conductive portion 215 may include a conductive object.

The pattern layer 210 may include a first pattern end portion 216 forming one end portion thereof and a second pattern end portion 217 forming the other end portion thereof opposite to the first pattern end portion 216.

The insulating layer 220 includes a first insulating end portion 221 forming one end portion thereof adjacent to the first pattern end portion 216 and a second insulating end portion 222 forming the other end portion thereof opposite to the first insulating end portion 221 so as to be adjacent to the second pattern end portion 217.

Figure 6:
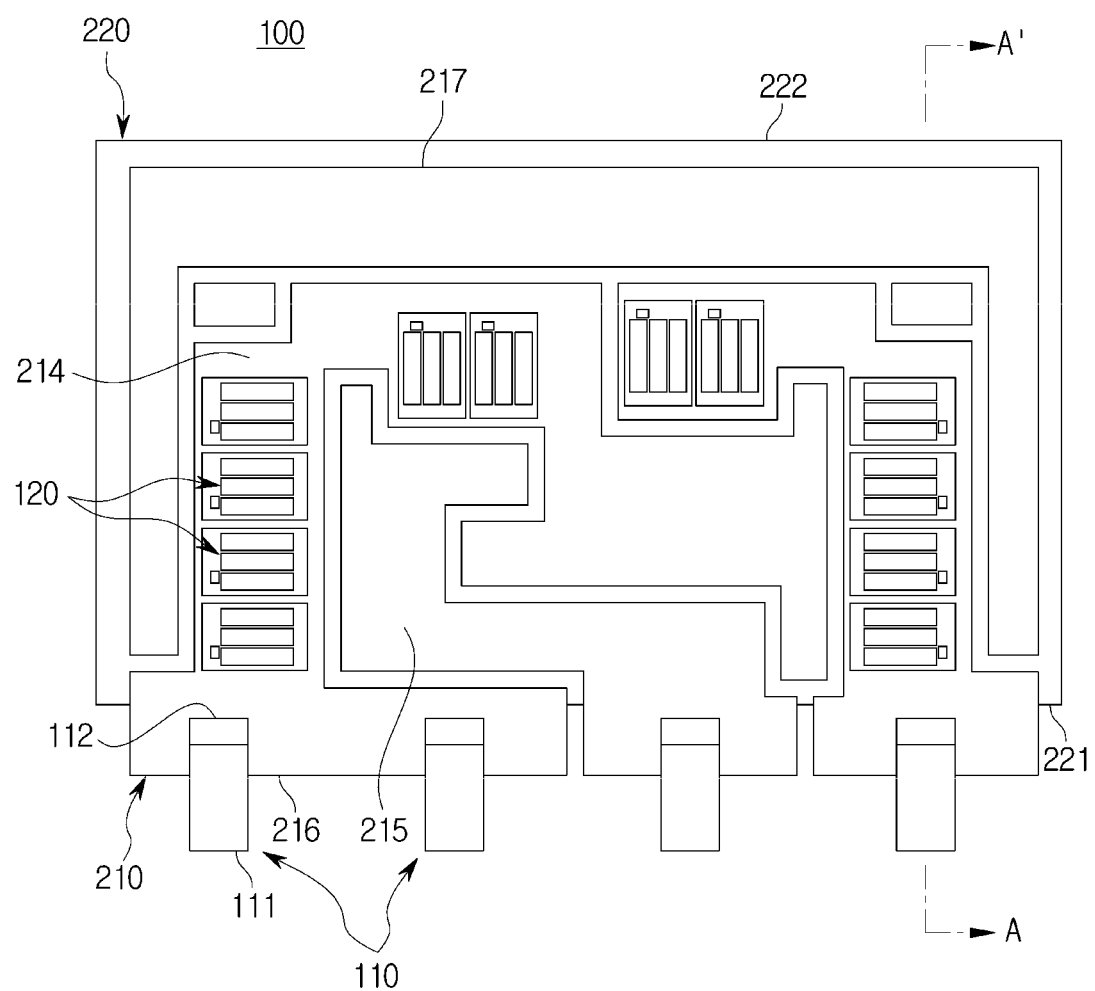
FIG. 6 is a cross-sectional view of a vehicle power module according to the present disclosure shown in FIG. 5.

FIG. 5 is a perspective view of a vehicle power module according to the present disclosure and FIG. 6 is a cross-sectional view of a vehicle power module according to the present disclosure shown in FIG. 5.

As shown in FIG. 5 and FIG. 6, the vehicle power module 100 may include a lead frame 110.

The lead frames 110 may be provided in plural. In FIGS. 5 and 6, four lead frames 110 are shown, but the present disclosure is not limited thereto.

The lead frame 110 may be configured to receive power from an outside or to output power to the outside. The lead frame 110 may be connected to an external device (not shown).

The lead frame 110 receives power from an external device (not shown), converts the power on the substrate 200, and outputs the power again to another external device (not shown).

Here, the external device (not shown) may be a power source such as a commercial power source, and may include the battery 42 and the motor 43. The lead frame 110 may include a DC terminal through which a DC power is input or output, or an AC terminal through which an AC power is input or output.

The lead frame 110 may be configured to bond with the substrate 200 (see FIG. 3). The lead frame 110 may be bonded to the pattern layer 210 by ultrasonic welding. The pattern layer 210 may be disposed to be electrically connected to the lead frame 110.

The vehicle power module 100 may include an element 120 that may be disposed in the element portion 214. The element 120 may be disposed in the element portion 214 to convert power. The element 120 may be provided in plural and may include a semiconductor element. However, it is not limited thereto.

The element 120 may be electrically connected to the pattern layer 210 and may be electrically connected to the lead frame 110 through the conductive portion 215.

The conductive portion 215 transmits a power input through the lead frame 110 to the element portion 214 and transmits the converted power to the lead frame 110.

The pattern layer 210 may electrically connect the element 120 and the lead frame 110 and may discharge heat generated by the element 120 to an outside. The pattern layer 210 may include plating, such as silver (Ag), for bonding the element 120 to a surface thereof. However, it is not limited thereto.

The insulating layer 220 may emit heat generated by the element 120 to an outside. The conductive layer 230 (see FIG. 7) may emit heat generated by the device 120 to an outside.

The lead frame 110 may be configured to be bent in a stepped manner. However, it is not limited thereto.

The lead frame 110 may include a first lead end portion 111 facing outward and a second lead end portion 112 facing the first lead end portion 111.

The first pattern end portion 216 may be disposed between the first lead end portion 111 and the second lead end portion 112.

The second lead end portion 112 may be disposed between the first pattern end portion 216 and the first insulating end portion 221.

Figure 7:
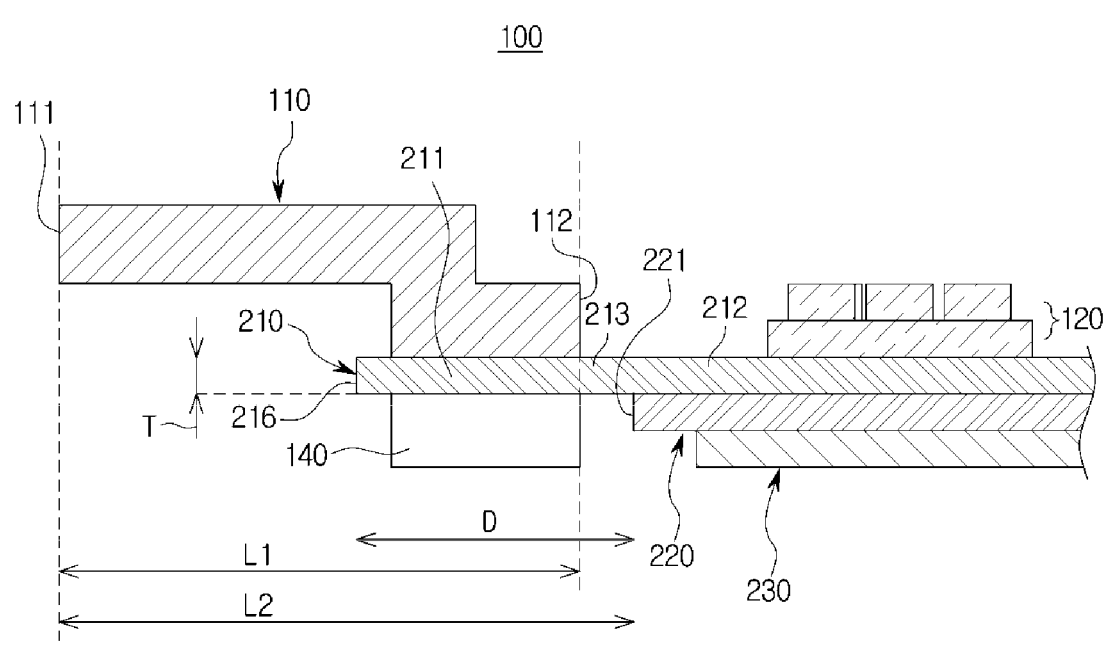
FIG. 7 is a cross-sectional side view of a vehicle power module according to the present disclosure viewed from A-A' in FIG. 6.

FIG. 7 is a cross-sectional side view of a vehicle power module according to the present disclosure viewed from A-A' in FIG. 6.

As shown in FIG. 7, the pattern layer 210 may be configured to protrude more than the insulating layer 220 toward the lead frame 110.

A size of a portion of the pattern layer 210 that protrudes more than the insulating layer 220 toward the lead frame 110 may be varied depending on a size of a bonding portion where the lead frame 110 is bonded to the pattern layer 210.

The horizontal distance L1 between the first lead end portion 111 and the second lead end portion 112 may be shorter than the horizontal distance L2 between the first lead end portion 111 and the first insulating end portion 221.

The lead frame 110 may be bonded to a portion of the pattern layer 210 corresponding to a gap D between the first pattern end portion 216 and the first insulating end portion 221. An area of the gap D between the first pattern end portion 216 and the first insulating end portion 221 may be larger than an area a portion where the lead frame 110 is bonded to the pattern layer 210.

The lead frame 110 may have various sizes. If the area of the portion where the lead frame 110 is bonded to the pattern layer 210 is larger than the area of the gap D between the first pattern end portion 216 and the first insulating end portion 221, the lead frame 110 may be greatly vibrated when the lead frame 110 is ultrasonically welded to the pattern layer 210.

A vibration of the lead frame 110 generated when the lead frame 110 is ultrasonically welded to the pattern layer 210 may reduce weld joint characteristics of the lead frame 110 and the pattern layer 210.

The vehicle power module 100 according to the present disclosure is configured such that the area of the gap D between the first pattern end portion 216 and the first insulating end portion 221 is larger than the area of the portion where the lead frame 110 is bonded to the pattern layer 210, the lead frame 110 is welded to the pattern layer 210 stably.

The area of the portion where the lead frame 110 is bonded to the pattern layer 210 may have various sizes according to an allowable current amount of the lead frame 110. However, the area of the portion where the lead frame 110 is bonded to the pattern layer 210 is limited by a size of a horn for applying ultrasonic waves and a bonding strength between the lead frame 110 and the pattern layer 210.

Preferably, the area of the portion where the lead frame 110 is bonded to the pattern layer 210 may be 500 mm*500 mm. However, it is not limited thereto.

The pattern layer 210 may include a first pattern portion 211 in contact with the insulating layer 220 and a second pattern portion 212 in contact with the lead frame 110. The pattern layer 210 includes a third pattern portion 213 provided between the first pattern portion 211 and the second pattern portion 212 so that the first pattern portion 211 and the second pattern portion 212 are spaced apart from each other.

That is, the first pattern portion 211 may be in contact with only the lead frame 110, the second pattern portion 212 may be in contact with only the element 120 and the insulating layer 220, and the third pattern portion 213 may not be in contact with any other components.

The vehicle power module 100 includes a support member 140. The support member 140 is disposed on the other side of the pattern layer 210 to prevent the pattern layer 210 from bending when the lead frame 110 is bonded to one side of the pattern layer 210.

The support member 140 may include a jig configured to allow the lead frame 110 to be efficiently welded to the substrate 200.

The support member 140 may be temporarily used when the lead frame 110 is ultrasonically welded to the substrate 200 and may not be included in the finally completed vehicle power module 100.

A thickness T of the pattern layer 210 of the vehicle power module 100 according to the present disclosure may be 0.15 mm or more. When the lead frame 110 is ultrasonically welded to the pattern layer 210, it is advantageous that the thickness T of the pattern layer 210 is thicker in order to mitigate an impact transmitted to the insulating layer 220.

However, the thickened pattern layer 210 may cause a peeling between the insulating layer 220 and the pattern layer 210 due to a difference in thermal expansion coefficient from the insulating layer 220. Therefore, it is advantageous that the thickness T of the pattern layer 210 is thinner in order to prevent the peeling between the pattern layer 210 and the insulating layer 220.

Since the insulating layer 220 may not be disposed under the pattern layer 210 to which the lead frame 110 is ultrasonically welded in the vehicle power module 100 according to the present disclosure, the thickness T of the pattern layer 210 may not be kept large to mitigate the impact transmitted to the insulating layer 220 when the lead frame 110 is ultrasonically welded to the pattern layer 210.

Therefore, the vehicle power module 100 according to the present disclosure keeps the thickness T of the pattern layer 210 as thin as possible.

It is preferable that the thickness T of the pattern layer 210 is 0.15 mm or more to prevent deformation of the pattern layer 210 due to the force applied by the ultrasonic welding with the lead frame 110. However, it is not limited thereto.

A thickness of the lead frame 110 may be reduced to reduce a force applied to the substrate 200 when the lead frame 110 is ultrasonically welded to the pattern layer 210. However, if the thickness of the lead frame 110 is reduced, the lead frame 110 may be deformed or broken when the lead frame 110 is coupled with an external device (not shown).

Since the insulating layer 220 may not be disposed under the pattern layer 210 to which the lead frame 110 is ultrasonically welded in the vehicle power module 100 according to the present disclosure, the thickness T of the lead frame 110 may be kept large regardless of the impact transmitted to the insulating layer 220.

Figure 8:
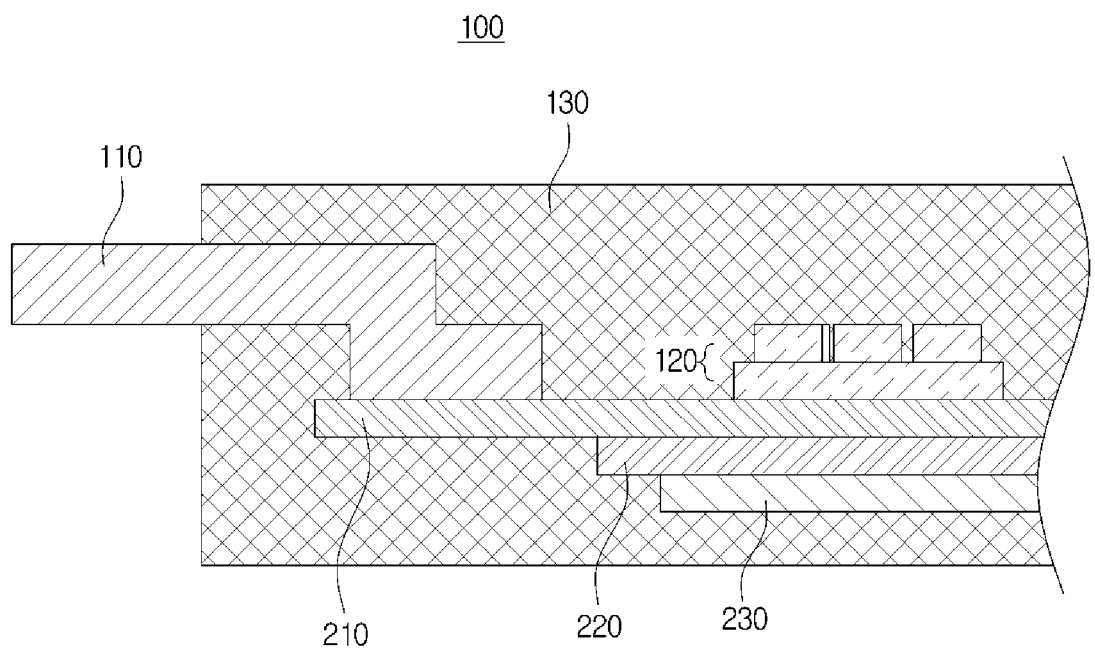
FIG. 8 is a view illustrating a molding member in a vehicle power module according to the present disclosure.

FIG. 8 is a view illustrating a molding member in a vehicle power module according to the present disclosure.

As shown in FIG. 8, the vehicle power module 100 may include a molding member 130 surrounding the lead frame 110 and the substrate 200 to reinforce the bonding between the lead frame 110 and the substrate 200.

The molding member 130 reinforces the bonding between the lead frame 110 and the pattern layer 210, the bonding between the pattern layer 210 and the element 120, the bonding between the pattern layer 210 and the insulating layer 220 and the bonding between the insulating layer 220 and the conductive layer 230.

The molding member 130 is molded on an outer surface of the lead frame 110 and an outer surface of the substrate 200 to insulate the lead frame 110 and the substrate 200 from an outside and improves the heat dissipation capability of the vehicle power module 100.

The molding member 130 may be made of an epoxy molding compound (EMC) resin material. The molding member 130 reinforces the rigidity of the vehicle power module 100

The lead frame 110 may be trimmed after molding the molding member 130.

According to the embodiment of the present disclosure, when the lead frame is ultrasonically welded to the substrate, breakage of the insulating layer made of ceramic is substantially prevented, so that a portion of products that are defective is minimized, and the quality of products can be improved.

The embodiment of the present disclosure can reduce the manufacturing cost of a product by reducing the amount of expensive ceramics for forming the insulating layer.

The embodiment of the present disclosure can prevent the peeling between the pattern layer and the insulating layer and improve the durability of the power module by forming the pattern layer in a thin shape.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A power module for a vehicle, comprising:
a lead frame configured to receive power from outside or to output power to the outside;
a substrate configured to be bonded with the lead frame by ultrasonic welding of flat surfaces of the lead frame and the substrate, wherein the substrate comprises:
a pattern layer disposed to be electrically connected to the lead frame,
a conductive layer disposed apart from the pattern layer in a thickness direction of the pattern layer, the conductive layer being electrically isolated from the pattern layer, and
an insulating layer disposed between the conductive layer and the pattern layer to insulate the pattern layer from the conductive layer; and
a molding member surrounding a bonding portion of the lead frame and the pattern layer to reinforce bonding of the lead frame and the pattern layer,
wherein the molding member surrounds the lead frame and the substrate to reinforce bonding between the lead frame and the substrate,
wherein the molding member completely encapsulates outer surfaces of the substrate, and
wherein the insulating layer further protrudes toward the lead frame than the conductive layer in a horizontal direction different from the thickness direction of the pattern layer.

2. The power module according to claim 1, wherein the pattern layer includes a first pattern portion in contact with the lead frame and a second pattern portion in contact with the insulating layer.

3. The power module according to claim 2, wherein the pattern layer further includes a third pattern portion provided between the first pattern portion and the second pattern portion such that the first pattern portion and the second pattern portion are spaced apart from each other.

4. The power module according to claim 1, wherein the lead frame includes a first lead end and a second lead end adjacent the pattern layer and opposite the first lead end, and
the insulating layer includes a first insulating end adjacent the lead frame and a second insulating end opposite the first insulating end, and
a horizontal distance between the first lead end and the second lead end is shorter than a horizontal distance between the first lead end and the first insulation end.

5. The power module according to claim 4, wherein the pattern layer includes a first pattern end adjacent to the lead frame and a second pattern end opposite to the first pattern end, and
the lead frame is bonded to the pattern layer between the first pattern end and the first insulating end.

6. The power module according to claim 5, wherein an area between the first pattern end and the first insulating end is larger than an area of the lead frame bonded to the pattern layer.

7. The power module according to claim 1, wherein the insulating layer comprises an alumina ceramic material.

8. The power module according to claim 1, wherein the pattern layer has a thickness of 0.15 mm or more.

* * * * *